United States Patent
Hsu

(10) Patent No.: US 12,015,043 B2
(45) Date of Patent: Jun. 18, 2024

(54) PACKAGING STRUCTURE, ELECTRONIC DEVICE, AND METHOD FOR MANUFACTURING THE PACKAGING STRUCTURE

(71) Applicant: TRIPLE WIN TECHNOLOGY(SHENZHEN) CO. LTD., Shenzhen (CN)

(72) Inventor: Hsin-Yen Hsu, New Taipei (TW)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 286 days.

(21) Appl. No.: 17/378,472

(22) Filed: Jul. 16, 2021

(65) Prior Publication Data

US 2022/0020809 A1 Jan. 20, 2022

(30) Foreign Application Priority Data

Jul. 17, 2020 (CN) .......................... 202021417817.6

(51) Int. Cl.
*H01L 27/146* (2006.01)
*G06F 1/16* (2006.01)

(52) U.S. Cl.
CPC .. *H01L 27/14636* (2013.01); *H01L 27/14603* (2013.01); *H01L 27/14687* (2013.01); *G06F 1/1686* (2013.01)

(58) Field of Classification Search
CPC ................................................. H01L 27/14618
See application file for complete search history.

(56) References Cited

U.S. PATENT DOCUMENTS

| | | | | |
|---|---|---|---|---|
| 9,001,268 | B2 * | 4/2015 | Azuma | H04N 23/57 348/374 |
| 9,029,759 | B2 * | 5/2015 | Singh | H01L 27/14685 250/239 |
| 11,665,815 | B2 * | 5/2023 | Zhang | H05K 1/0271 361/760 |
| 2013/0270419 | A1 * | 10/2013 | Singh | H01L 27/14625 257/E31.127 |
| 2014/0043525 | A1 * | 2/2014 | Azuma | G03B 3/10 348/357 |
| 2019/0043906 | A1 * | 2/2019 | Wu | H01L 27/14636 |
| 2022/0020809 | A1 * | 1/2022 | Hsu | H01L 27/14618 |
| 2022/0294940 | A1 * | 9/2022 | Wang | H01L 27/14618 |
| 2023/0309237 | A1 * | 9/2023 | Hsu | H01L 27/14618 174/254 |

* cited by examiner

*Primary Examiner* — Mounir S Amer
*Assistant Examiner* — Alexander Belousov
(74) *Attorney, Agent, or Firm* — ScienBiziP, P.C.

(57) ABSTRACT

A packaging structure for an image sensor used in an electronic device includes a flexible circuit board, a reinforcing plate, an image sensor, and an adhesive layer. The reinforcing plate is disposed on the flexible circuit board. The image sensor is disposed in the reinforcing plate. The adhesive layer bonds the flexible circuit board, the reinforcing plate, the image sensor and the conductor.

11 Claims, 4 Drawing Sheets

PACKAGING STRUCTURE, ELECTRONIC DEVICE, AND METHOD FOR MANUFACTURING THE PACKAGING STRUCTURE

FIELD

The subject matter herein generally relates to a packaging structure, an electronic device, and a method for manufacturing the packaging structure.

BACKGROUND

There are two types of packaging structures for image sensors. In one type, the image sensor is disposed in an opening of a ceramic substrate with wirings, and the ceramic substrate is connected to a flexible circuit board to realize electrical connection between the image sensor and the circuit board. However, the ceramic substrate may be easily warped and cracked when external force is applied. In other type, the imaging sensor is disposed in an opening of a rigid-flexible circuit board. The opening is defined at the rigid portion of the circuit board. However, the defining of the opening may result in some fragments which may drop on the image sensor and affect the imaging quality of the image sensor.

BRIEF DESCRIPTION OF THE DRAWINGS

Implementations of the present technology will now be described, by way of example only, with reference to the attached figures.

DETAILED DESCRIPTION

Figure 1:
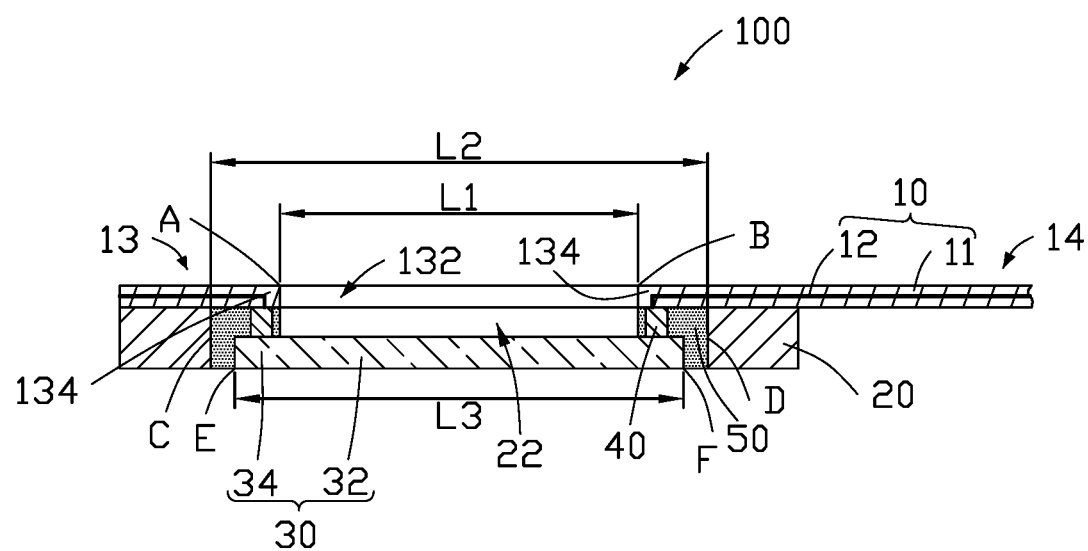
FIG. 1 is a cross-sectional view of an embodiment of a packaging structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict exists, the following embodiments and features in the embodiments can be combined with each other.

Referring to FIG. 1, an embodiment of the present disclosure as shown provides a packaging structure 100. The packing structure 100 includes a flexible circuit board 10, an image sensor 30, a reinforcing plate 20, a conductor 40, and an adhesive layer 50. The image sensor 30 is disposed on the flexible circuit board 10. The flexible circuit board 10 is electrically connected to the image sensor 30 through the conductor 40. The reinforcing plate 20 is disposed on the flexible circuit board 10 and surrounds a periphery of the image sensor 30. The adhesive layer 50 bonds together the flexible circuit board 10, the image sensor 30, the reinforcing plate 20, and the conductor 40.

The flexible circuit board 10 includes a dielectric layer 11 and a circuit layer 12 disposed in the dielectric layer 11. The circuit layer 12 can conduct electricity.

The flexible circuit board 10 includes a first flexible board portion 13 and a second flexible board portion 14. The first flexible board portion 13 is connected to the second flexible board portion 14. The first flexible board portion 13 is electrically connected to the image sensor 30, and the second flexible board portion 14 is electrically connected to an external circuit through a connector (not shown).

The first flexible board portion 13 includes a first opening 132. The first opening 132 penetrates the first flexible board portion 13 along a thickness direction of the first flexible board portion 13. A shape of the first opening 132 can be as required, such as circular, square, or rectangular.

The first flexible board portion 13 includes a protruding portion 134. The protruding portion 134 surrounds the first opening 132. A portion of the circuit layer 12 in the protruding portion 134 is exposed from the dielectric layer 11, and the portion of the circuit layer 12 can electrically connect to the image sensor 30.

The reinforcing plate 20 is disposed on the first flexible board portion 13. The reinforcing plate 20 includes a second opening 22. The second opening 22 is in communication with the first opening 132. The protruding portion 134 protrudes from the periphery of the second opening 22 toward a center axis of the second opening 22. The reinforcing plate 20 increases a strength of the flexible circuit board 10, and thus can maintain a flatness of the flexible circuit board 10.

Referring to FIG. 1, a first point A and a second point B shown are any two different points of the protruding portion 134, and the first point A and the second point B are on the periphery of the first opening 132. A third point C and a fourth point D are any two different points on the periphery of the second opening 22. The first point A, the second point B, the third point C, and the fourth point D are all in a same plane. A distance between the first point A and the second point B is defined as L1, and a distance between the third point C and the fourth point D is defined as L2. The distance L1 is less than the distance L2, that is, L1<L2.

The reinforcing plate 20 is connected to and insulated from the flexible circuit board 10. The reinforcing plate 20 is connected to the dielectric layer 11. In at least one embodiment, the reinforcing plate 20 can be made of a metal material or a non-metal material. The metal material may be steel, and the non-metal material may be epoxy resin.

The image sensor 30 includes a photosensitive area 32 and a connecting area 34 surrounding the photosensitive area 32. The photosensitive area 32 can receive light and form image signals accordingly. The connecting area 34 can electrically connect to the flexible circuit board 10.

The image sensor 30 is disposed in the second opening 22 and is spaced from the reinforcing plate 20 and the flexible circuit board 10. The photosensitive area 32 corresponds to the first opening 132, that is, the photosensitive area 32 is exposed from the first opening 132. The connecting area 34 is disposed in a projection area of the protruding portion 134 on the second opening 22. The connecting area 34 is electrically connected to the protruding portion 134 through the conductor 40. The conductor 40 is further connected to the circuit layer 12. The conductor 40 may be gold balls, tin balls, silver glue, and the like.

A fifth point E and a sixth point F represent one of any two different points on a periphery of the image sensor 30. The fifth point E, the sixth point F and the first point A, the second point B, the third point C and the fourth point D are all in the same plane. A distance between the fifth point E and the sixth point F is defined as L3. The distance L1 is less than the distance L3, and the distance L3 is less than the distance L2. That is, L1<L3<L2.

The adhesive layer 50 infills gaps among the protruding portion 134, the reinforcing plate 20, the connecting area 34, and the conductor 40. The adhesive layer 50 bonds together the flexible circuit board 10, the reinforcing plate 20, the image sensor 30 and the conductor 40. The adhesive layer 50 also covers at least a portion of the conductor 40 away from the reinforcing plate 20. The adhesive layer 50 may be made of a thermosetting adhesive or a UV-curable thermosetting adhesive.

Figure 2:
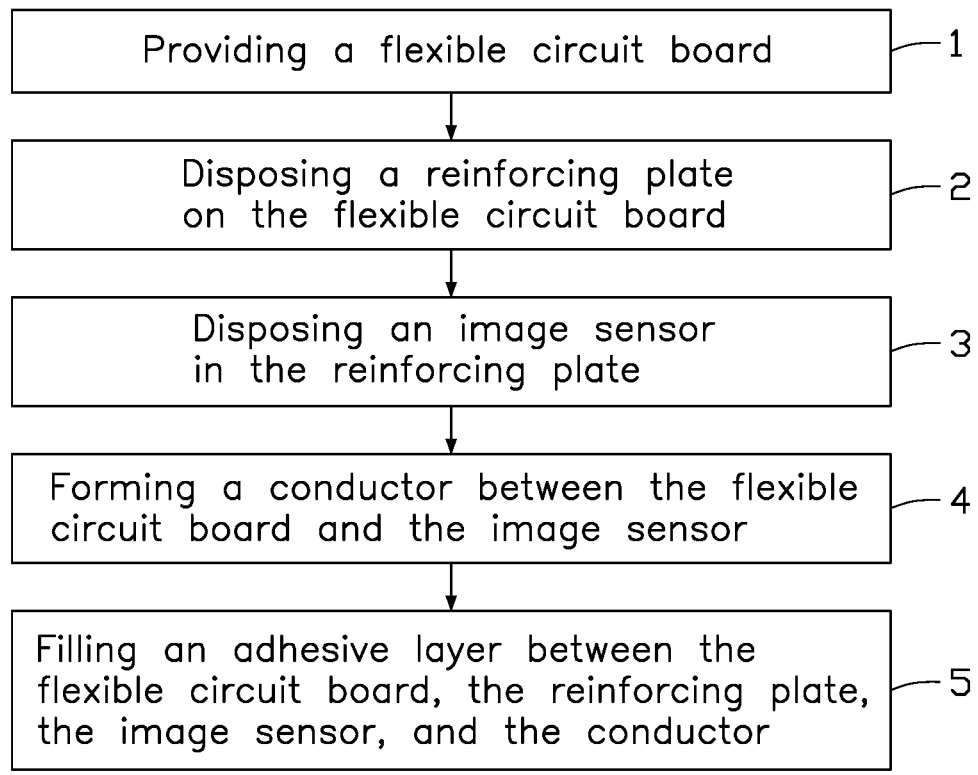
FIG. 2 is a flowchart of an embodiment of a method for manufacturing a packaging structure according to the present disclosure.

Referring to FIG. 2, a method for manufacturing the packaging structure 100 is presented in accordance with an embodiment. The method is provided by way of example, as there are a variety of ways to carry out the method. The method can begin at block 1.

In block 1: a flexible circuit board 10 is provided. The flexible circuit board 10 includes a first opening 132.

The flexible circuit board 10 includes a dielectric layer 11 and a circuit layer 12 disposed in the dielectric layer 11. The first flexible board portion 13 includes a protruding portion 134. The protruding portion 134 surrounds the first opening 132. A portion of the circuit layer 12 in the protruding portion 134 is exposed from the dielectric layer 11.

In block 2: a reinforcing plate 20 is disposed on the flexible circuit board 10. The reinforcing plate 20 includes a second opening 22. The second opening 22 is disposed to correspond to the first opening 132. The periphery surrounding the first opening 132 protrudes from the second opening 22.

In block 3: an image sensor 30 is provided. The image sensor 30 includes a photosensitive area 32 and a connecting area 34 surrounding the photosensitive area 32. The image sensor 30 is disposed in the second opening 22 and is spaced apart from the reinforcing plate 20 and the flexible circuit board 10. The photosensitive area 32 corresponds to the first opening 132. The connecting area 34 corresponds to the protruding portion 134.

In block 4: a conductor 40 is formed between the protruding portion 134 and the connecting area 34. The conductor 40 is electrically connected to the flexible circuit board 10 and the image sensor 30.

In block 5: an adhesive layer 50 infills gaps among the protruding portion 134, the reinforcing plate 20, the connecting area 34, and the conductor 40. The adhesive layer 50 bonds together the flexible circuit board 10, the reinforcing plate 20, the image sensor 30, and the conductor 40. The adhesive layer 50 also covers the conductor 40 exposed from the protruding portion 134 and the connecting area 34. Thereby, the packaging structure 100 is obtained.

Figure 3:
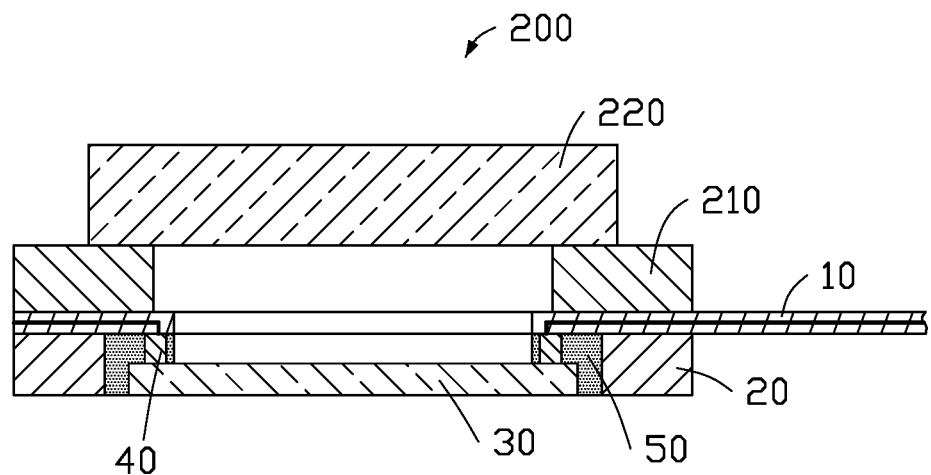
FIG. 3 is a cross-sectional view of an embodiment of a lens module.

Referring to FIG. 3, a lens module 200 is provided. The lens module 200 includes the packaging structure 100, a lens holder 210, and a lens 220. The lens holder 210 is disposed on the flexible circuit board 10 away from the reinforcing plate 20. The lens holder 210 is connected to the first flexible board portion 13, and the second flexible board portion 14 protrudes from the lens holder 210. The lens 220 is disposed on the lens holder 210 away from the packaging structure 100.

Figure 4:
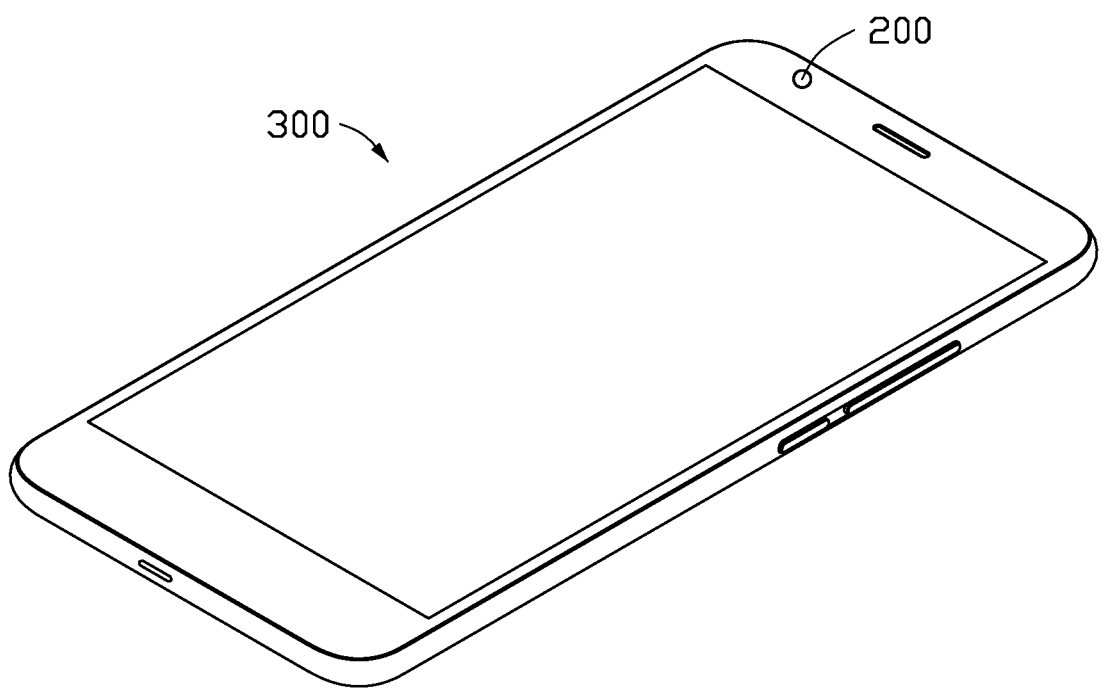
FIG. 4 is a cross-sectional view of an embodiment of an electronic device.

Referring to FIG. 4, the lens module 200 can be applied in various electronic devices 300 with image-capturing function, such as camera, mobile phones, wearable devices, computer equipment, vehicles, or monitoring devices. In an embodiment, the lens module 200 is applied to a mobile phone.

The packaging structure 100 has a stable structure. A combination of the reinforcing plate 20 and the flexible circuit board 10 ensures that the flexible circuit board 10 has sufficient flatness. In addition, the packaging structure 100 will not generate fragments that may affect the quality of the image sensor 30.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A packaging structure comprising:
   a flexible circuit board comprising a first opening and a protruding portion surrounding the first opening;
   a reinforcing plate disposed on the flexible circuit board, the reinforcing plate comprising a second opening connected to the first opening, and the protruding portion protruding from a periphery of the second opening toward a center axis of the second opening;
   a conductor;
   an image sensor comprising a photosensitive area and a connecting area surrounding the photosensitive area, the image sensor disposed in the second opening, the connecting area and the protruding portion spaced apart from each other, the conductor electrically connecting the protruding portion to the protruding portion, the photosensitive area exposed from the first opening; and
   an adhesive layer bonding together the protruding portion, the reinforcing plate, the connecting area, and the conductor, the adhesive layer disposed between a periphery of the image sensor and an inner sidewall of the second opening of the reinforcing plate, and the adhesive layer further covering the conductor.

2. The packaging structure of claim 1, wherein a periphery of the first opening comprises a first point A and a second point B, the periphery of the second opening comprises a third point C and a fourth point D, the first point A, the second point B, the third point C, and the fourth point D are all in a same plane, a distance between the points A and B is less than a distance between the third point C and the fourth point D.

3. The packaging structure of claim 2, wherein a periphery of the image sensor comprises a fifth point E and a sixth point F, the fifth point E, the sixth point F and the first point A and the second point B are all in the same plane, the distance between the first point A and the second B is less than a distance between the fifth point E and the sixth point F.

4. The packaging structure of claim 1, wherein the flexible circuit board further comprises a dielectric layer and a circuit layer disposed in the dielectric layer, the conductor further connects the circuit layer to the connecting area, and the adhesive layer further connects the dielectric layer to the connecting area.

5. The packaging structure of claim 1, wherein the reinforcing plate is made of metal.

6. The packaging structure of claim 1, wherein the reinforcing plate is made of non-metal.

7. The packaging structure of claim 1, wherein the conductor comprises gold balls, tin balls, or silver glue.

8. An electronic device comprising:
a packaging structure comprising:
a flexible circuit board comprising a first opening and a protruding portion surrounding the first opening;
a reinforcing plate disposed on the flexible circuit board, the reinforcing plate comprising a second opening connected to the first opening, and the protruding portion protruding from a periphery of the second opening toward a center axis of the second opening;
a conductor;
an image sensor comprising a photosensitive area and a connecting area surrounding the photosensitive area, the image sensor disposed in the second opening, the connecting area and the protruding portion spaced apart from each other, the conductor electrically connecting the protruding portion to the protruding portion, the photosensitive area exposed from the first opening; and
an adhesive layer bonding together the protruding portion, the reinforcing plate, the connecting area, and the conductor, the adhesive layer disposed between a periphery of the image sensor and an inner sidewall of the second opening of the reinforcing plate, and the adhesive layer further covering the conductor.

9. The electronic device of claim 8, wherein a periphery of the first opening comprises a first point A and a second point B, the periphery of the second opening comprises a third point C and a fourth point D, the first point A, the second point B, the third point C, and the fourth point D are all in a same plane, a distance between the points A and B is less than a distance between the third point C and the fourth point D.

10. The electronic device of claim 9, wherein a periphery of the image sensor comprises a fifth point E and a sixth point F, the fifth point E, the sixth point F and the first point A and the second point B are all in the same plane, the distance between the first point A and the second B is less than a distance between the fifth point E and the sixth point F.

11. The electronic device of claim 8, wherein the flexible circuit board further comprises a dielectric layer and a circuit layer disposed in the dielectric layer, the conductor further connects the circuit layer to the connecting area, and the adhesive layer further connects the dielectric layer to the connecting area.

* * * * *